(12) United States Patent
Look et al.

(10) Patent No.: US 6,465,305 B1
(45) Date of Patent: Oct. 15, 2002

(54) METHODS AND CIRCUITS EMPLOYING THRESHOLD VOLTAGES FOR MASK-ALIGNMENT DETECTION

(75) Inventors: Kevin T. Look, Fremont, CA (US); Shih-Cheng Hsueh, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/043,962

(22) Filed: Jan. 8, 2002

Related U.S. Application Data

(62) Division of application No. 09/561,785, filed on May 1, 2000.

(51) Int. Cl.[7] .............................................. H01L 29/80
(52) U.S. Cl. ...................................... 438/275; 257/391
(58) Field of Search ........................... 33/645; 257/391; 438/275, 289, 18

(56) References Cited

U.S. PATENT DOCUMENTS

| | | | |
|---|---|---|---|
| 4,178,605 A | | 12/1979 | Hsu et al. |
| 4,386,459 A | | 6/1983 | Boulin |
| 4,571,538 A | | 2/1986 | Chow |
| 4,647,850 A | | 3/1987 | Henderson et al. |
| 4,811,078 A | * | 3/1989 | Tigelaar et al. ............. 257/306 |
| 5,627,083 A | * | 5/1997 | Tounai ........................ 356/401 |
| 5,770,995 A | | 6/1998 | Kamiya |
| 5,976,938 A | | 11/1999 | Gardner et al. |
| 6,238,982 B1 | * | 5/2001 | Krivokapic et al. ......... 438/163 |

\* cited by examiner

*Primary Examiner*—David Nelms
*Assistant Examiner*—David Vu
(74) *Attorney, Agent, or Firm*—Arthur J. Behiel; Edel M. Young

(57) ABSTRACT

Described are mask-alignment detection structures that measure both the direction and extent of misalignment between layers of an integrated circuit. Each structure includes one or more MOS transistors, each of which exhibits a threshold voltage that varies with misalignment in one dimension. The test structures are configured in mirrored pairs, so that misalignment in one direction oppositely affects the threshold voltages of the paired structures. The threshold voltages of the paired structures can therefore be compared to determine the extent and direction of misalignment. Measurements in accordance with the invention are relatively insensitive to process variations, and the structures using to take these measurements can be formed along with other features on an integrated circuit using standard processes. One embodiment of the invention may be used to measure misalignment between active implants and the windows in which active regions are formed. Other embodiments measure misalignment between threshold-voltage implants and the active regions.

12 Claims, 7 Drawing Sheets

$V_{T1} < V_{T2}$ $V_{T3} > V_{T4}$

METHODS AND CIRCUITS EMPLOYING
THRESHOLD VOLTAGES FOR
MASK-ALIGNMENT DETECTION

FIELD OF THE INVENTION

The invention relates to semiconductor fabrication, and in particular to mask-alignment test structures for measuring the alignment of superimposed elements formed on and within a semiconductor layer.

BACKGROUND

Most semiconductor devices are built up using a number of material layers. Each layer is patterned to add or remove selected portions to form circuit features that will eventually make up a complete integrated circuit. The patterning process, known as photolithography, defines the dimensions of the circuit features.

The goal of the patterning process is to create circuit features in the exact dimensions required by the circuit design and to place them in the proper locations on the surface of a semiconductor wafer. Perfect alignment is an ideal that cannot be achieved in practice. Instead, the various layers of an integrated circuit are misaligned to some extent. Such misalignment is termed "mask misalignment" because misaligned mask images are the source of the error. When circuits fail during fabrication, it is desirable to determine whether the source of the failure is incorrect mask alignment.

There are a number of conventional methods of detecting mask misalignment. For example, U.S. Pat. No. 5,770,995 to Masayuki Kamiya describes a structure that identifies misalignment between a conductive layer and a contact window layer. The disclosed structure indicates the direction of mask misalignment but does not provide an accurate measure of the extent of misalignment. Each of U.S. Pat. No. 4,386,459 to David Boulin and U.S. Pat. No. 4,571,538 to Pei-Ming Chow describe structures that indicate both the direction and extent of mask misalignment. The above-mentioned U.S. Patents provide useful background information, and are therefore incorporated herein by reference.

FIG. 1A is a plan view of mask regions used to define a conventional MOS transistor 100. FIG. 1B depicts MOS transistor 100 in cross section, taken along line A–A' of FIG. 1A. A window 105 in an insulating layer 110 (FIG. 1B) serves as a mask to form the active regions of MOS transistor 100. Window 105 might be formed, for example, along with similar windows in a field-oxide layer used to define active regions in a standard CMOS process. The term "active region" refers here to the area encompassing the source, drain, and channel regions of MOS transistor 100 in particular, and MOS transistors in general.

Modern semiconductor processes allow for precise adjustment of transistor threshold voltages. Threshold-voltage adjustments are made by altering the conductivity of transistor channel regions by implanting relatively low concentrations of dopants. N-channel and P-channel transistors require different dopant types and concentrations, so masks are used to expose the target areas and to shield other areas from inappropriate implants. These masks must therefore be properly aligned. FIG. 1A depicts the boundary 111 of an exemplary threshold-voltage implant; FIG. 1B depicts a threshold-voltage implant 112.

After formation of threshold-voltage implant 112, a gate 115, and a gate insulator 120 are formed over the region defined within window 105. Dopant atoms are then implanted in window 105 to create the source and drain regions. FIG. 1A depicts the boundary of an exemplary active-region implant 121; the mask used to define boundary 121 must be aligned with window 105. Gate 115 —typically polysilicon—masks the underlying substrate 117, thus defining a channel region 122 between source and drain regions 125 and 130. In modern CMOS processes, the active-region implant largely defines the dopant level in gate 115, so that the conductivity type of gate 115 matches that of source and drain regions 125 and 130 for both PMOS and NMOS transistors.

Misalignment of the threshold-voltage implant mask produces very little change in resistance, and is therefore difficult to measure using alignment-measuring schemes that depend upon variations in resistance. Misalignment of the active-region implant is also difficult to measure using resistive means because salicide formations in the active regions greatly reduce the sheet resistance of the active regions, and therefore obscure resistance variations that result from misaligned active-implant masks. There is therefore a need for a mask-alignment detection structure that accurately indicates the direction and extent of misalignment for circuit features that produce little resistive variation when misaligned.

SUMMARY

The present invention satisfies the need for an accurate mask-alignment detection structure that measures both the direction and extent of misalignment between features of an integrated circuit. Measurements taking using structures in accordance with the invention are relatively insensitive to process variations, and the test structures can be formed along with other features on an integrated circuit using standard processes.

One embodiment of the invention measures the extent to which active-region implants are aligned with the areas on a semiconductor substrate in which the active regions are to be formed. One test structure in accordance with that embodiment is an MOS transistor that conventionally includes source and drain regions separated by a gate. A pair of active-region implants of a first conductivity type defines the source and drain regions, and an additional active-region implant of a second conductivity type extends over a portion of the gate. The additional active-region implant affects the threshold voltage of the affected portion of the gate; consequently, the gate exhibits two separate threshold voltages. The overall threshold voltage of the test structure is a function of the separate threshold voltages of the gate.

Misalignment of the active region implant in the gate changes the relative areas of the implanted and non-implanted portions of the gate, and consequently changes the overall threshold voltage of the test structure. The overall threshold voltage increases for misalignment in one direction and decreases with misalignment in the opposite direction. The threshold voltage of the test structure therefore provides a measure of alignment.

Another embodiment of the invention improves measurement accuracy by including a second test structure that mirrors the first test structure. Misalignment affects the two test structures in opposite ways, so the respective threshold voltages can be compared to determine the direction of misalignment. Process variations unrelated to alignment generally affect both test structures in the same way and therefore tend to cancel out.

Comparing the threshold voltages of two mirrored structures indicates whether and in what direction the active-region implants are misaligned; however, the difference between the threshold voltages can be difficult to correlate to an extent of misalignment. Another embodiment of the invention addresses this problem with an array of matching test-structure pairs. Each pair differs from the others in the relative areas of the implanted and non-implanted gate portions. When perfectly aligned, the threshold voltages of the test structures in each pair match, but the threshold voltages differ from one pair to the next. Misalignment causes the threshold voltages within each pair of test structures to diverge. The collection of diverging threshold-voltage values can be used to accurately determine the direction and extent of misalignment.

The structures and methods described above are easily adapted for use in measuring the alignment of threshold-voltage implants with respect to active regions. In one such embodiment, special threshold-voltage implants that extend beneath only a portion of the gate of an MOS transistor cause the transistor to have two channel areas with different threshold voltages. The resulting MOS transistor is much the same as the above-described test structure, and is similarly employed in pairs and arrays to detect and measure misalignment.

This summary does not purport to define the invention. The invention is defined by the claims.

DETAILED DESCRIPTION

Figure 2A:
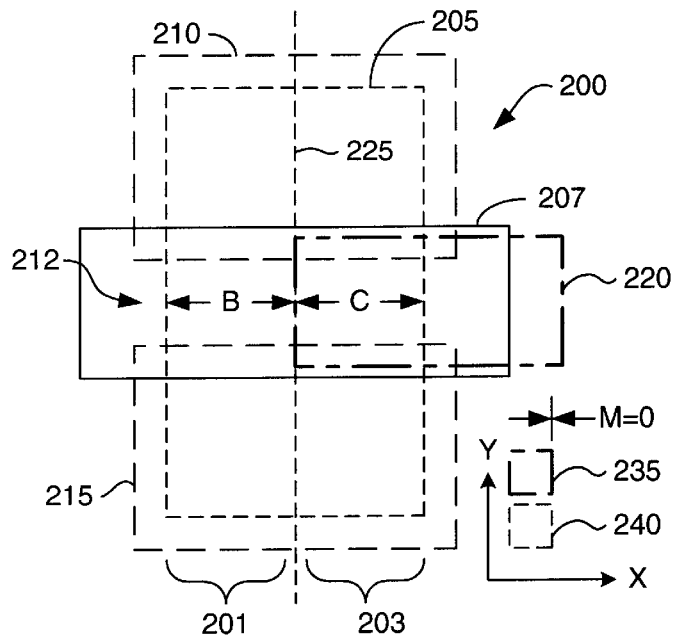
FIG. 2A is a plan view of an inventive mask-alignment detection structure 200 that may be used to measure the extent to which active-region implants are aligned with the windows that define the boundaries of the respective active regions.
Figure 2B:
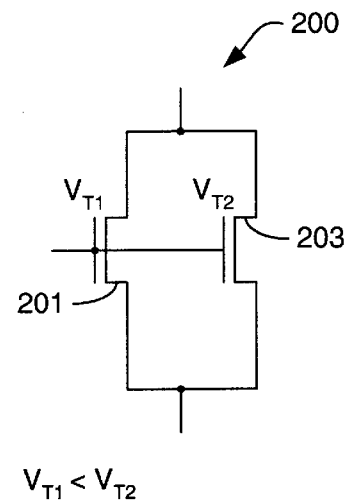
FIG. 2B schematically depicts structure 200 as a pair of parallel-coupled MOS transistors 201 and 203.

FIG. 2A is a plan view of an inventive mask-alignment detection structure 200 that may be used to determine whether active-region implants are aligned with the windows that define the boundaries of the respective active regions; FIG. 2B schematically depicts structure 200 as a pair of parallel-coupled MOS transistors 201 and 203.

Figure 1A:
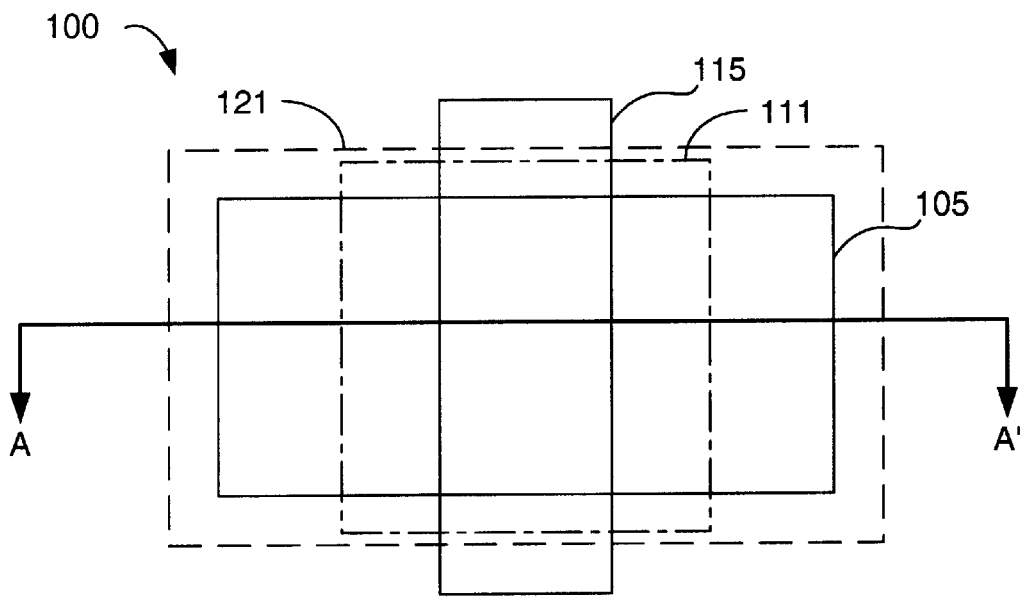
FIG. 1A is a plan view of mask regions used to define a conventional MOS transistor.

Structure 200 includes a window 205 that, like window 105 of FIG. 1A, defines an active region. A gate 207 and an underlying gate insulator (not shown) are conventionally patterned over window 205. A pair of active-region implants 210 and 215 defines respective source and drain regions of a first conductivity type (e.g., n-type) on either side of a channel region 212. An additional active-region implant 220 of a second conductivity type (e.g., p-type) extends over all or a portion of gate 207. In the depicted embodiment, active-region implant 220 extends about half way across window 205 over channel region 212, resulting in a first gate region of a length B and a second gate region of a length C. The different doping levels of gate 207 divide structure 200 into two parallel transistors 201 and 203, as illustrated by an imaginary line 225.

Active-region implants 210 and 215 are formed during the process sequence used to form other active-region implants on the integrated circuit. For example, n-type active-region implants 210 and 215 may be formed using the same mask used to form the active regions of NMOS transistors located elsewhere on the integrated circuit. Active-region implant 220 is likewise created during the process sequence used to form other active-region implants. For example, a p-type active-region implant 220 may be formed using the same mask used to form the active regions of PMOS transistors located elsewhere on the integrated circuit. Misalignment of active-region implants 210, 215, and 220 indicates similar misalignment for structures formed using the same masks.

Structure 200 includes features 235 and 240. As indicated by their similar borders, features 235 and 240 are created using the respective masks for active-region implant 220 and window 205. Features 235 and 240 are not actual features of the invention, but instead serve to illustrate that in the example of FIG. 2A the masks used to form the various layers are perfectly aligned in the X dimension (i.e., misalignment M=0). Similar features illustrate the extent of misalignment for layers depicted in other figures.

The threshold voltage $V_T$ of an n-type MOS transistor depends, in part, on the work function of the material used to form the gate, and the work function of the gate depends on the dopant type and concentration in the gate. Increasing the work function of the gate, as by adding p-type dopants, increases the threshold voltage. Conversely, reducing the work function of the gate, as by adding n-type dopants, reduces the threshold voltage. Thus, if we assume that active-region implants 210 and 215 are n-type, and that active-region implant 220 is p-type, then the threshold voltage $V_{T1}$ of transistor 201 is lower than the threshold voltage $V_{T2}$ of transistor 203 (i.e., $V_{T1}<V_{T2}$). The threshold voltage $V_{TC1}$ of structure 200 is somewhere between $V_{T1}$ and $V_{T2}$, affected by the contributions of both transistors. (P-type MOS transistors are similarly affected by gate-dopant type and concentration, except that adding n-type dopants to the gate increases the absolute threshold voltage and adding p-type dopants decreases the absolute threshold voltage.)

Figure 2C:
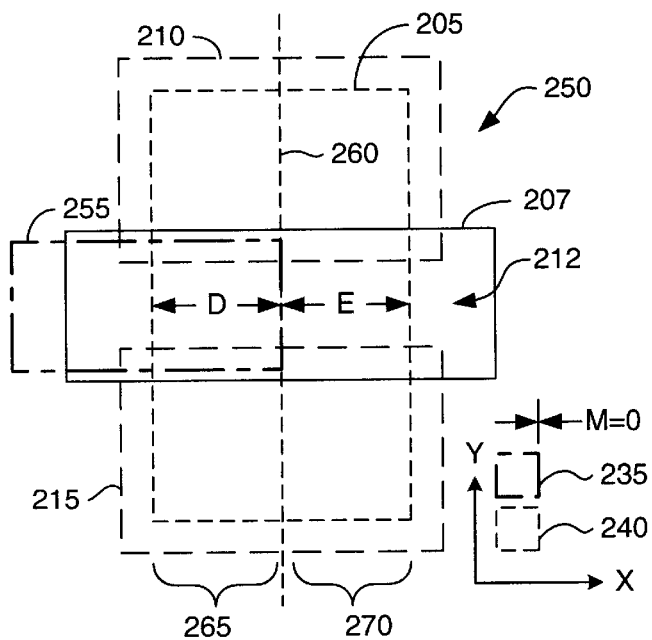
FIGS. 2C and 2D depict a test structure 250 similar to test structure 200 of FIGS. 2A and 2B, like-numbered elements being the same.
Figure 2D:
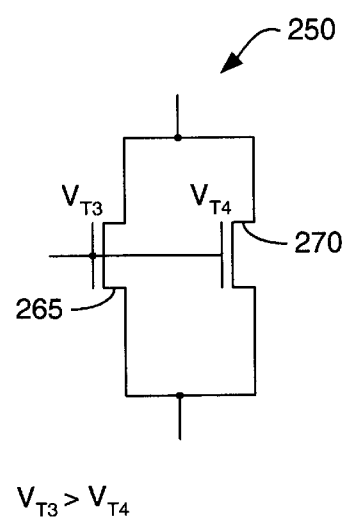
Figure 3A:
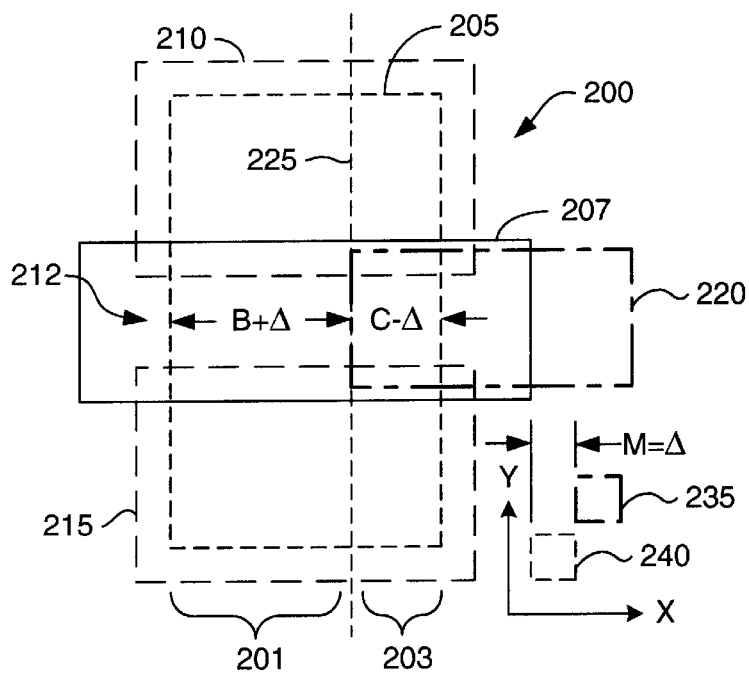
FIGS. 3A, 3B, 3C, and 3D depict the same test structures 200 and 250 described above in connection with FIGS. 2A–2D.
Figure 3B:
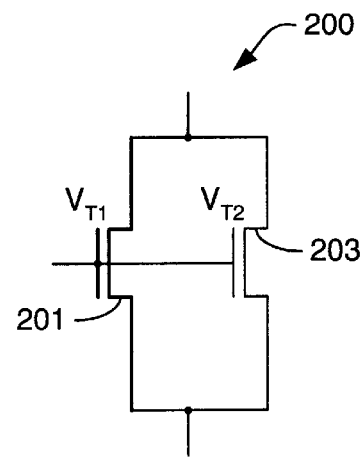
Figure 3C:
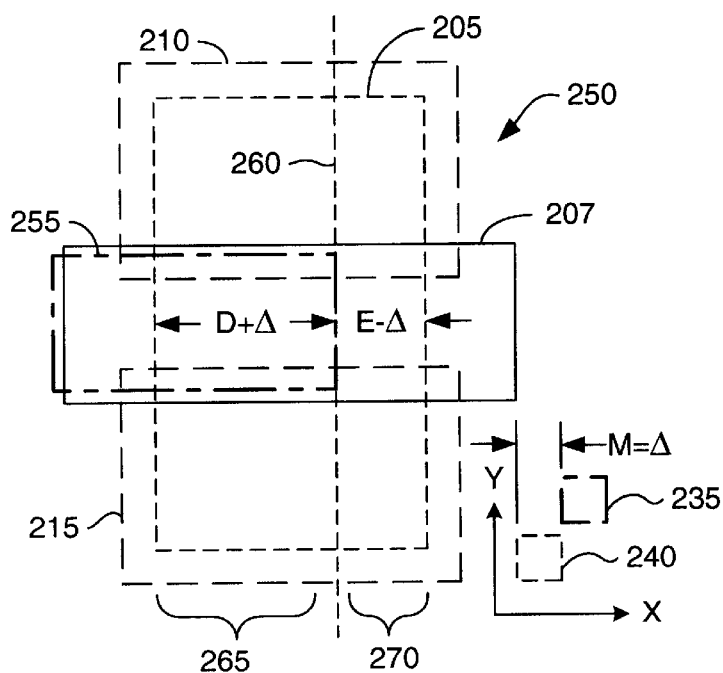
Figure 3D:
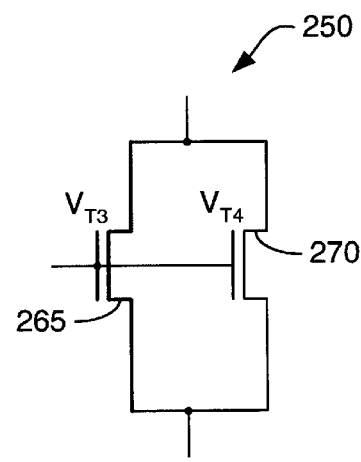

FIGS. 2C and 2D depict a test structure 250 similar to test structure 200 of FIGS. 2A and 2B, like-numbered elements being the same. Test structure 250 is formed on the same integrated circuit as test structure 200, and includes a second active-region implant 255 that mirrors active-region implant 220 of FIG. 2A. That is, active-region implant 255 extends across the respective window 205 in a direction opposite to active-region implant 220, producing an overlap length D between active-region implant 255 and the underlying window 205. The different doping levels of gate 207 divide structure 250 into parallel transistors 265 and 270, is illustrated by an imaginary line 260.

Overlap length C of FIG. 2A is identical to overlap length D of FIG. 2C (i.e., C=D). Transistors 203 and 265 are therefore identical, and should have the same threshold voltages (i.e., $V_{T2}=V_{T3}$). Transistors 201 and 270 are also identical—assuming the widths of windows 205 are equal—and therefore have the same threshold voltages (i.e., $VT_{T1}=V_{T4}$). Further, the threshold voltage $V_{TC2}$ of the combined transistors 265 and 270 equals the threshold voltage $V_{TC1}$ of the combined transistors 201 and 203. As explained below in detail, any misalignment of the mask used to form active-region implants 220 and 255 with respect to the mask used to form windows 205 upsets this balance by changing the respective current drive of each of transistors 201, 203, 265, and 270. The changed threshold voltages $V_{TC1}$ and $V_{TC2}$ can then be measured and compared to determine whether and in what direction active-region implants 220 and 255 are misaligned with windows 205.

FIGS. 3A, 3B, 3C, and 3D depict the same test structures 200 and 250 described above in connection with FIGS. 2A–2D. FIGS. 3A–3D differ in that active-region implant 220, active-region implant 255, and feature 235 are misaligned with respect to windows 205 and feature 240 by a misalignment Δ. As a consequence of this misalignment, the gate regions of transistors 201 and 265 are wider and the gate regions of transistors 203 and 270 are narrower by misalignment Δ, as compared to their counterparts in FIGS. 2A–2D.

The change in gate width does not change the threshold voltages of the various transistors, but the transistors with wider gates play a larger role in determining the respective overall threshold voltages $V_{TC1}$ and $V_{TC2}$ of structures 200 and 250. Thus, whereas threshold voltages $V_{TC1}$ and $V_{TC2}$ were equal in the configuration of FIGS. 2A and 2C, threshold voltages $V_{TC1}$ and $V_{TC2}$ differ in the configuration of FIGS. 3A and 3C. This difference indicates misalignment.

The wider transistor 201 in structure 200 has a lower threshold voltage $V_{T1}$ than the narrower transistor 203. Thus, the respective increase and decrease in the channel widths of transistors 201 and 203 reduces the overall threshold voltage $V_{TC1}$ of structure 200, as compared with the properly aligned structure of FIG. 2A. In contrast, the wider transistor 265 in structure 250 has a higher threshold voltage $V_{T3}$ than the narrower transistor 270. Thus, the respective increase and decrease in the channel widths of transistors 265 and 270 change the overall current through transistor 250 at some gate voltage, and increase the overall threshold voltage $V_{TC2}$ of structure 250. The fact that threshold voltage $V_{TC1}$ is less than threshold voltage $V_{TC2}$ indicates that active-region implants 220 and 255 are misaligned with respect to windows 205 in the positive X direction (the effect is opposite if active-region implants 220 and 255 are n-type).

Figure 4A:
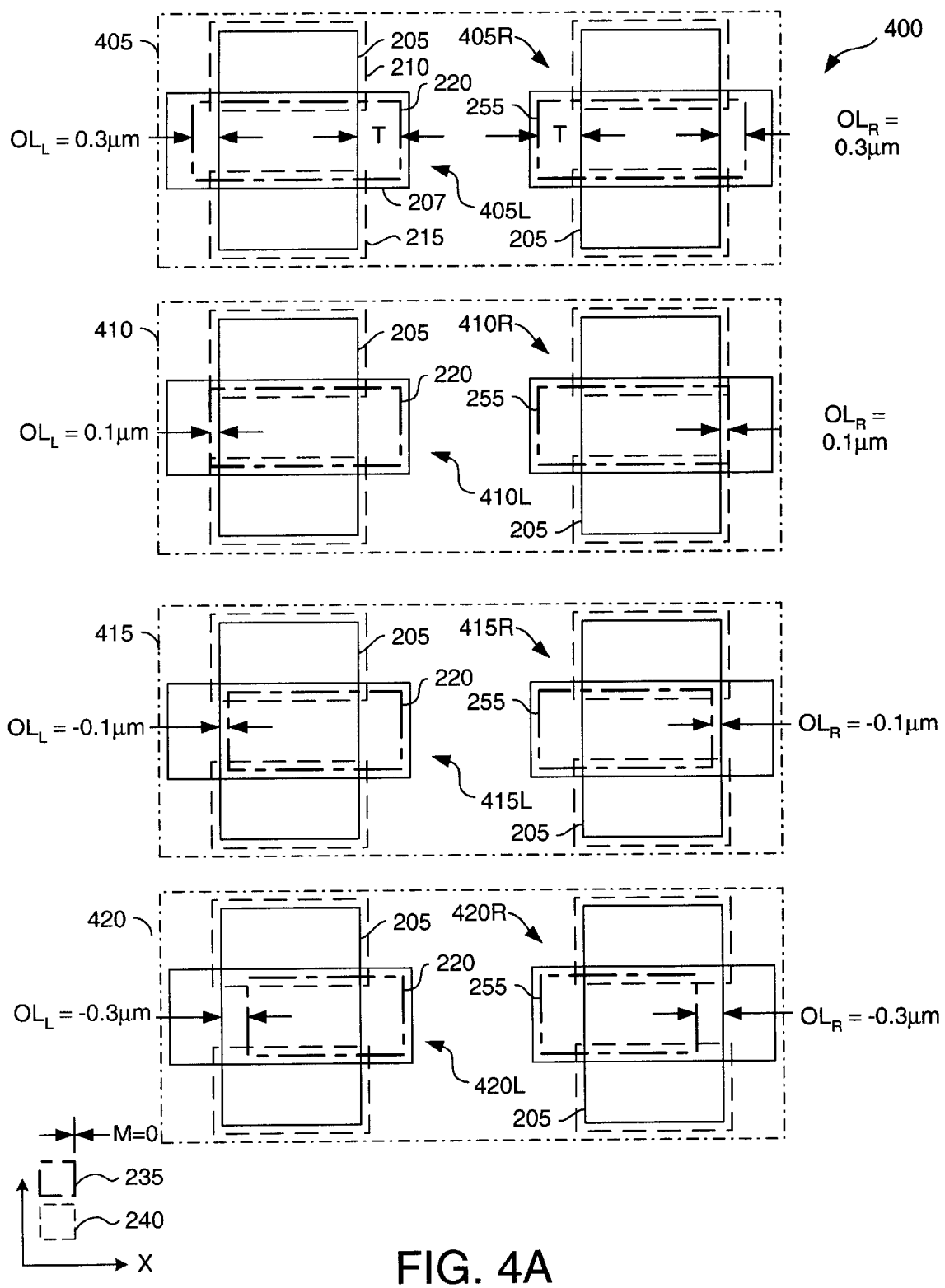
FIG. 4A depicts a mask-alignment measurement structure 400 that includes an array of structures 405, 410, 415, and 420.

Comparing the threshold voltages $V_{TC1}$ and $V_{TC2}$ of structures 200 and 250 indicates whether and in what direction the active-region implants are misaligned with the windows defining the active regions; however, the difference between the threshold voltages $V_{TC1}$ and $V_{TC2}$ can be difficult to correlate to an extent of misalignment. FIG. 4A depicts a mask-alignment measurement structure 400 that addresses this problem. Structure 400 includes an array of test structures 405, 410, 415, and 420, each of which includes a pair of test structures similar to structures 200 and 250 of FIGS. 2A through 3D, where like elements are designated using the same reference numbers.

Referring first to the upper left-hand corner of FIG. 4A, a test structure 405L (the left-hand test structure within structure 405) is designed so that active-region implant 220 extends to the left beyond the boundary of window 205 by an overlap length $OL_L$ of 0.3 μm, and to the right beyond the boundary of window 205 by an alignment tolerance T. Tolerance T is some amount greater than the maximum expected misalignment in the X direction. Likewise, referring now to the upper right-hand corner of FIG. 4A, a test structure 405R is designed so that the respective active-region implant 255 extends to the right beyond the boundary of window 205 by an overlap length $OL_R$ of 0.3 μm, and to the left beyond the boundary of window 205 by tolerance T.

A second pair of test structures 410L and 410R is identical to the pair consisting of test structures 405L and 405R, except that the respective left and right overlap lengths $OL_L$ and $OL_R$ are reduced to 0.1 μm. A third pair of test structure 415L and 415R is identical to the above test structures, except that the respective left and right overlap lengths $OL_L$ and $OL_R$ are reduced to −0.1 μm. Finally, a fourth pair of test structure 410L and 410R is also identical to the above test structures, except that the respective left and right overlap lengths $OL_L$ and $OL_R$ are again reduced, this time to −0.3 μm. The number of pairs of test structures is reduced for simplicity. In one embodiment, the right and left overlap lengths range from 1 μm to −1 μm in increments of 0.1 μm.

The left-hand test structures precisely mirror their right-hand counterparts; consequently, the threshold voltages of the left-hand test structures are identical to the threshold voltages of the respective right-hand side test structures (e.g., the threshold voltage of structure 405L equals the threshold voltage of structure 405R). The threshold voltages of the pairs differ from one another, however, due to the different overlap lengths between their respective active-region implants and windows 205.

Figure 4B:
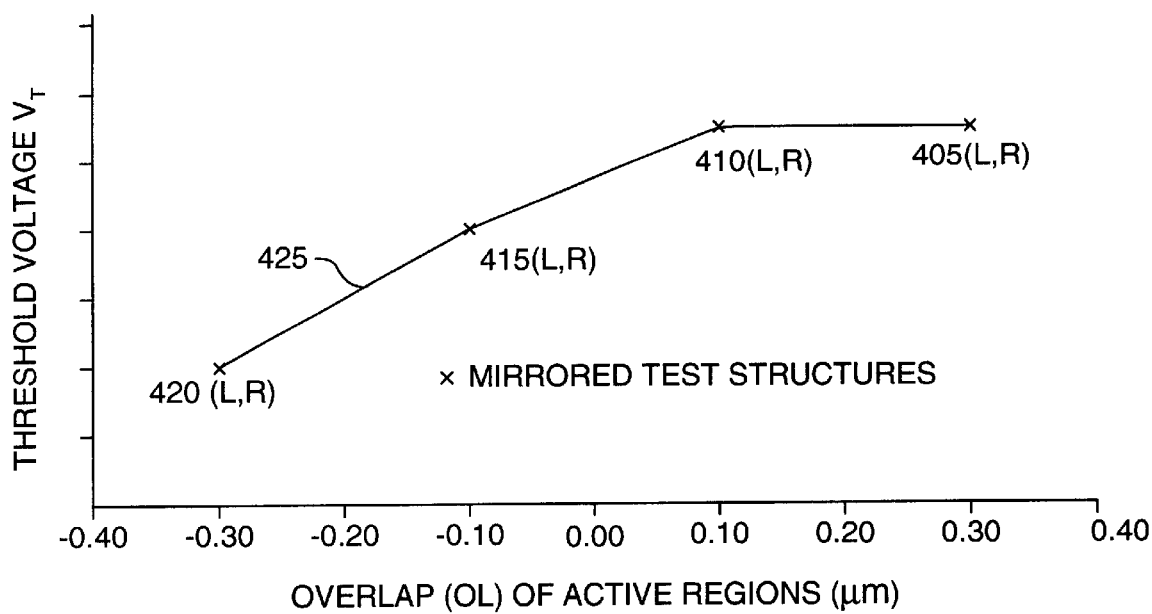
FIG. 4B is a graph depicting the relationship between overlap length OL and threshold voltage $V_T$ for the various test structures of mask-alignment measurement structure 400.

FIG. 4B is a graph depicting the relationship between overlap length OL and threshold voltage $V_T$ for the various test structures of mask-alignment measurement structure 400 of FIG. 4A. Structures 405L and 405R have the same overlap length (i.e., 0.3 μm) and therefore have identical threshold voltages. These identical values are plotted on a curve 425 as the "x" at the far right. Likewise, the relative threshold voltages of each successive pair of test structures are plotted on curve 425. Curve 425 is illustrative: actual threshold voltages are not given because they vary with process variations.

Figure 5B:
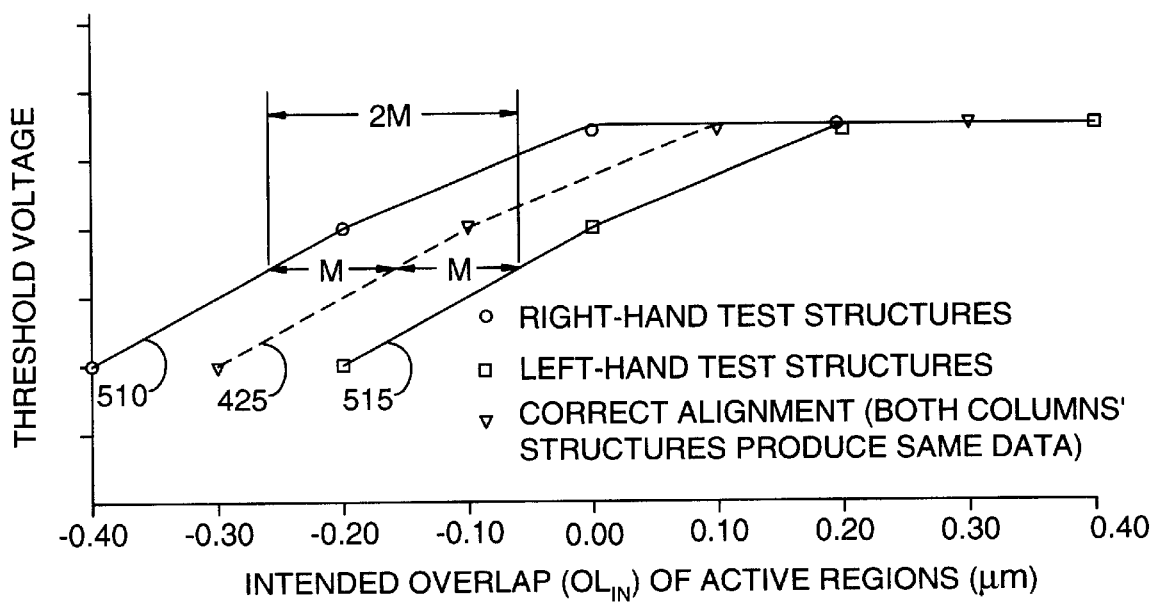
FIG. 5B is a graph depicting the relationship between intended overlap length $OL_{IN}$ and the measured threshold voltage $V_T$ for the various right- and left-hand test structures of FIG. 5A.
Figure 5A:
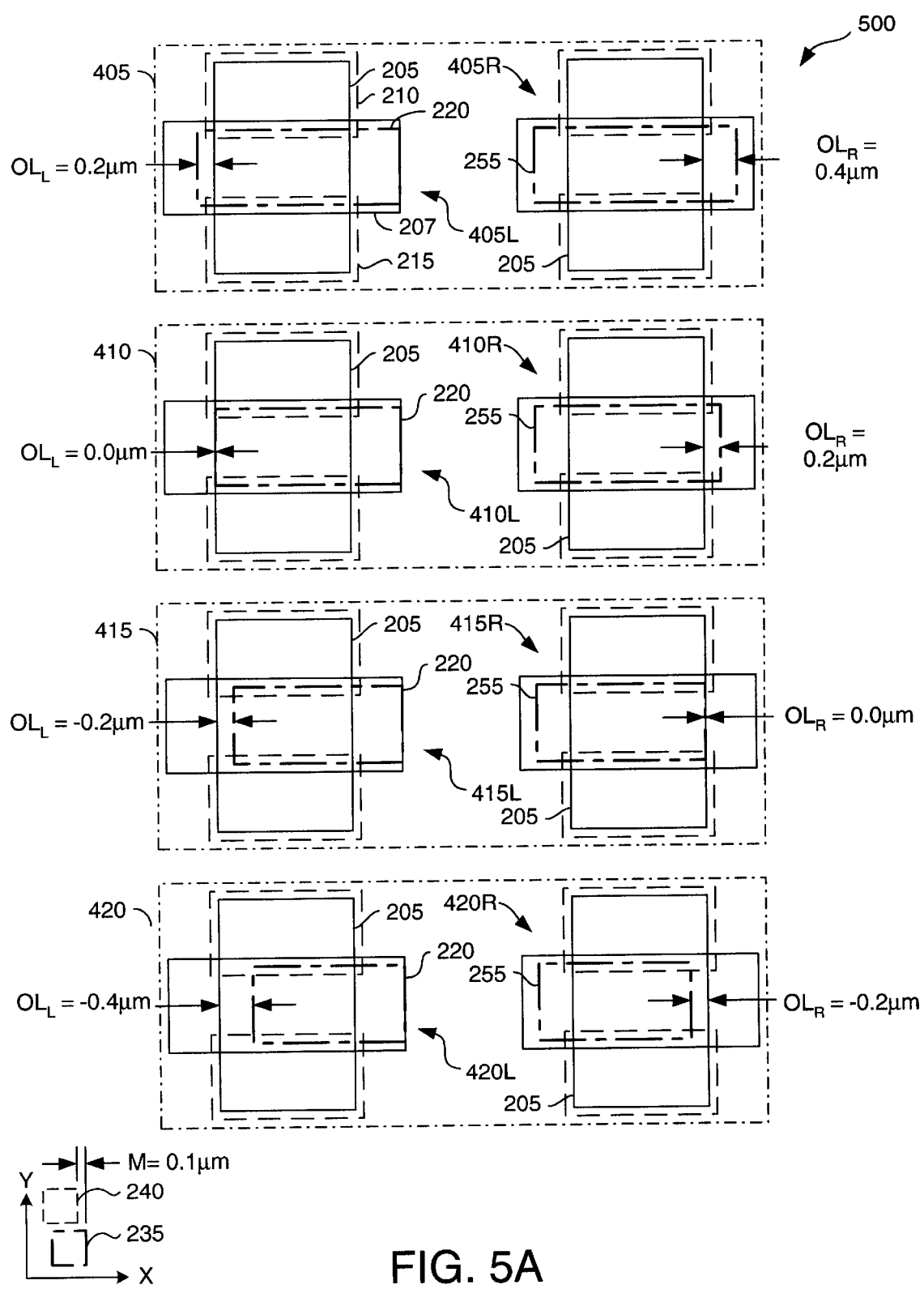
FIG. 5A depicts a mask-alignment measurement structure 500 similar to mask-alignment measurement structure 400 of FIG. 4A.

FIG. 5A depicts a mask-alignment measurement structure 500 similar to mask-alignment measurement structure 400 of FIG. 4A. Structure 500 differs from structure 400 in that each active-region implants 220 and 255 are misaligned with respect to windows 205 by an alignment error Δ of 0.1 μm in the positive X direction. Due to this misalignment, the overlap length $OL_L$ of each left-hand side test structure is reduced by 0.1 μm and the overlap length $OL_R$ of each right-hand side test structure is increased by 0.1 μm. Features 235 and 240 at the bottom of FIG. 5A indicate the extent of misalignment M.

For illustrative purposes, misalignment M is assumed to be 0.1 μm. In practice, the error M is not known, but is to be determined. The "intended" overlap is known, as the intended overlaps are specified in the layout used to fabricate structure 500 and the rest of the integrated circuit. The intended overlap lengths $OL_{IN}$ for structures 405(L,R), 410(L,R), 415(L,R), and 420(L,R) are 0.3, 0.1, −0.1, and −0.3 μm, as depicted in FIG. 4A.

FIG. 5B is a graph depicting the relationship between intended overlap length $OL_{IN}$ and the measured threshold voltage $V_T$ for the various right- and left-hand test structures of FIG. 5A. The graph includes three curves 425, 510, and 515. Curve 425 is the ideal curve taken from FIG. 4B, in which active-region implants 220 and 225 are precisely aligned with windows 205. Square data points represent threshold-voltage data taken from test structures selected from the left-hand side of structure 500 (identified with the suffix "L"); circular data points represent resistance data taken from test structures selected from the right-hand side of structure 500 (identified with the suffix The threshold voltages $V_T$ of the right-hand test structures are generally increased and the threshold voltages $V_T$ of left-hand test structures are generally decreased due to the misalignment. Consequently, curve 510, drawn through the circular data points, is similar to the ideal curve but shifted to the left by 0.1 μm, the misalignment M. Likewise, curve 515, drawn through the square data points, is similar to ideal curve 425 but shifted to the right 0.1 μm. Misalignment M is calculated by measuring the offset of curves 510 and 515 in the X dimension and dividing the result by two. These results assume that active-region implants 220 and 255 increase the work function of the affected regions of respective gates 207.

The shapes of curves 510, 425, and 515 can change due to misalignment in the Y dimension and other process variations. However, the spacing between curves 510 and 515 in the x dimension (twice the misalignment M) is relatively independent of these factors, provided the process variations are not extreme. Thus, structure 500 produces an accurate measure of both the extent and direction of misalignment.

The following Table 1 illustrates how hypothetical data— obtained using an exemplary misaligned structure similar to structure 500 of FIG. 5A—is used to measure misalignment. Threshold voltages $V_{TO}$ through $V_{T3}$ are hypothetical. The first column, labeled "Error," represents an amount of misalignment M between active-region implants 220 255 and windows 205; in other words, between the active-region implants and the corresponding active regions. In this example, the error M is positive when implants 220 and 255 shifted to the right (i.e., the positive X direction) respect to windows 205.

TABLE 1

| ERROR (μm) | SIDE | 405 (0.3) | 410 (0.1) | 415 (−0.1) | 420 (−0.3) |
|---|---|---|---|---|---|
| M = 0 | L | $V_{T0}$ | $V_{T1}$ | $V_{T2}$ | $V_{T3}$ |
|  | R | $V_{T0}$ | $V_{T1}$ | $V_{T2}$ | $V_{T3}$ |
| M = 0.2 | L | $V_{T1}$ | $V_{T2}$ | $V_{T3}$ |  |
|  | R |  | $V_{T0}$ | $V_{T1}$ | $V_{T2}$ |
| M = −0.2 | L |  | $V_{T0}$ | $V_{T1}$ | $V_{T2}$ |
|  | R | $V_{T1}$ | $V_{T2}$ | $V_{T3}$ |  |

The two rows labeled M=0 show that the threshold voltages corresponding to L and R (the respective left- and right-side test structures) are equal for each of structures 405, 410, 415, and 420. The rows labeled M=0.2 show that for a misalignment of 0.2 μm the threshold voltages corresponding the left-side structures decrease and the threshold voltages of the right side increase so that equivalent threshold voltages are offset by 0.4 μm, or 2 M. For example, threshold voltage $V_{T1}$ is associated with the left side of structure 405 and the right side of structure 415. These structures were designed to have overlaps that differ by 0.4 μm; the fact that they exhibit the same threshold voltage indicates that their respective active-region implants are shifted 0.2 μm with respect to conductive windows 205. The equivalent threshold voltages $V_{T2}$ associated with the left-hand test structure 410L and the right-hand test structure 420R indicate the same degree of misalignment. The fact that the threshold voltages for the left-hand test structures are lower than those of the right-hand test structures indicates that active-region implants 220 and 255 are misaligned to the right. Finally, the rows labeled M=−0.2 show that for a misalignment of −0.2 μm the threshold voltages corresponding the left-side structures increase and the threshold voltages of the right side decrease so that equivalent threshold voltages are offset by −0.4 μm, or 2 M. The fact that the left-hand test structures exhibit higher threshold voltages than do the right-hand test structures indicates that active-region implants 220 and 255 are misaligned to the left with respect to windows 205.

Figure 1B:
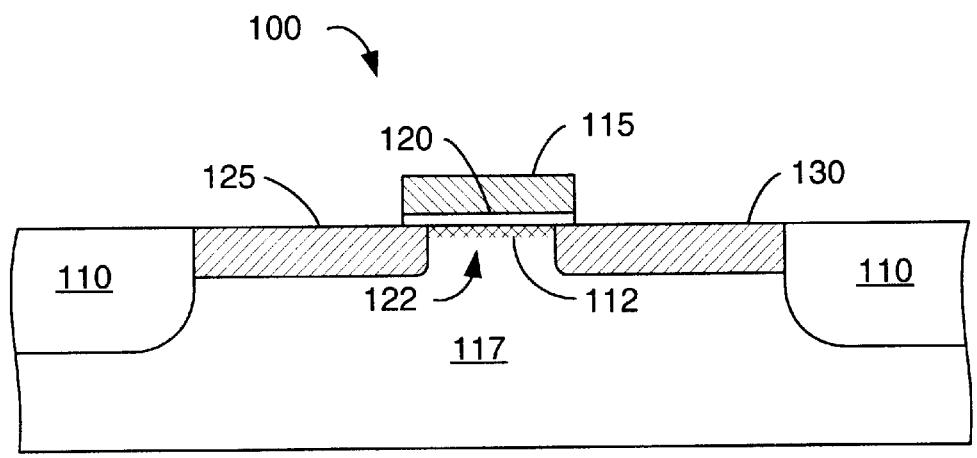
FIG. 1B depicts an MOS transistor 100 in cross section, taken along line A–A' of FIG. 1A.

The structures and methods described above are easily adapted for use in measuring the alignment of threshold-voltage implants with respect to active regions. Referring to FIGS. 1A and 1B, for example, some embodiments of the invention can be used to ensure that threshold-voltage implant 112 is aligned with window 105, the boundary of an active region.

The threshold voltage $V_T$ of an MOS transistor depends, in part, on the dopant type and concentration in the channel region. For example, adding p-type dopants to the channel region of an n-type transistor increases the threshold voltage, and adding n-type dopants to the channel region of an n-type transistor decreases the threshold voltage. The dependence of threshold voltage upon channel doping is well known to those skilled in the art.

Figure 6A:
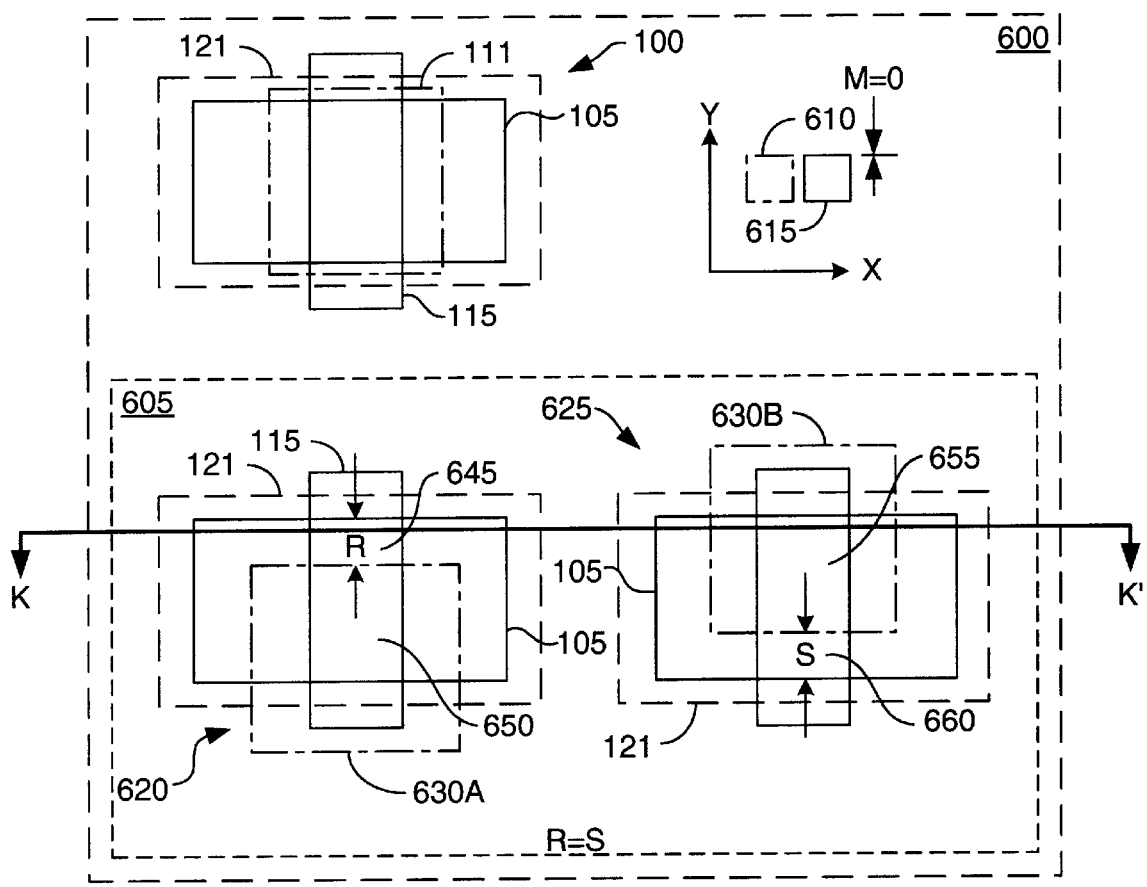
FIG. 6A depicts a portion of an integrated circuit 600 that includes a test structure 605, in accordance with the invention, along with the conventional transistor 100 depicted in FIGS. 1A and 1B.

FIG. 6A depicts a portion of an integrated circuit 600 that includes a test structure 605 in accordance with the invention along with the conventional transistor 100 depicted in FIGS. 1A and 1B. FIG. 6A includes a plan view of the feature boundaries of transistor 100 to show the relative alignment of window 105, threshold-voltage implant boundary 111, active-region implant boundary 121, and gate 115. IC 600 also includes imaginary features 610 and 615 to illustrate that threshold-voltage implant boundary 111 is aligned in a Y dimension with window 105. This alignment is desirable, as the threshold-voltage implant (defined within boundary 111) should alter the doping level in the channel region, the area of window 105 directly below the subsequently formed gate 115.

Test structure 605 includes a pair of transistors 620 and 625. Transistors 620 and 625 are substantially identical, but intentionally differ in the alignment their respective threshold-voltage implant regions 630A and 630B. Threshold-voltage implant region 630A extends into the respective window 105 of transistor 620 in the positive Y direction, whereas threshold-voltage implant region 630B extends into the respective window 105 of in the negative Y direction. Thus configured, misalignment of the mask used to form threshold-voltage implant regions 111, 630A, and 630B with respect to the mask used to form windows 105 will have substantially the same effect on the threshold voltages of both transistors 620 and 625 if the misalignment is in the x dimension, but will have opposite effects on transistors 620 and 625 if the misalignment is in the Y dimension. The presence and direction of misalignment in the Y dimension can therefore be determined by comparing the threshold voltages of transistors 620 and 625.

Figure 6B:
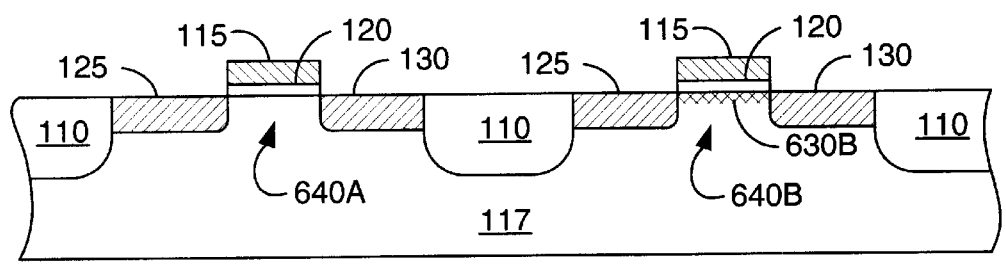
FIG. 6B is a cross section of transistors 620 and 625 taken along line K–K' of FIG. 6A.

FIG. 6B is a cross section of transistors 620 and 625 taken along line K–K' of FIG. 6A, and illustrates that threshold-voltage adjustment implant 630B extends across line K–K' and threshold-voltage adjustment implant 630A does not. Channel region 640A beneath gate 115 of transistor 620 includes a first active region 645 (FIG. 6A) having first dopant concentration and a second active region 650 having a second dopant concentration determined, in part, by threshold-voltage implant region 630A. Channel region 640B of transistor 625 similarly includes two active regions, a third active region 655 having the second dopant concentration and a fourth active region 660 having the first dopant concentration.

Transistors 620 and 625 detect misalignment in much the same way as structures 200 and 250 of FIGS. 2A through 5B. The threshold voltages of transistors 620 and 625 depend upon the channel doping of respective channel regions 640A and 640B, and therefore upon the extent to which threshold-voltage implants 630A and 630B overlap windows 105. In the case of perfect alignment in the Y dimension, the threshold voltages of transistors 620 and 625 are identical; the respective threshold voltages differ in proportion to the extent of misalignment in the Y dimension. Arrays of transistor pairs having incremental changes in the extent of overlap can be used as described above in connection with FIGS. 4A–5B to accurately measure the extent and direction of misalignment between the threshold-voltage implants and the active regions defined within windows 105.

While the present invention has been described in connection with specific embodiments, variations of these embodiments will be obvious to those of ordinary skill in the art. For example, the embodiments of FIGS. 4A and 4B are illustrated as having four pairs of test structures. Actual circuit implementations can include many more, and semiconductor wafers might include many arrays of such test structures. Further, each of the above-described structures measures misalignment in one dimension. Similar structures oriented in other dimensions detect misalignment in other directions. Therefore, the spirit and scope of the appended claims should not be limited to the foregoing description.

What is claimed is:

1. A method of determining an extent to which an active diffusion pattern of an integrated circuit is aligned in a plane with active regions of the integrated circuit, the method comprising forming a plurality of transistors, each having a gate partially implanted using the active diffusion pattern to form a first gate region having a first work function and a second gate region having a second work function, wherein the threshold voltage of each transistor varies in proportion to an extent of misalignment, in one direction, between the active diffusion pattern and the active regions.

2. The method of claim 1, further comprising measuring the respective threshold voltages of the transistors.

3. The method of claim 1, further comprising forming a second plurality of transistors, each having a gate partially implanted using the active diffusion pattern to form a third gate region having the second work function and a fourth gate region having the first work function, wherein the threshold voltage of each of the second plurality of transistors varies in inverse proportion of the extent of misalignment in the one direction.

4. A method of determining an extent to which an implant region of an integrated circuit is aligned in a plane with an active region of the integrated circuit, the method comprising:

a. forming a first test structure including:
  i. a first source region;
  ii. a first drain region;
  iii. a first channel region of a first area between the first source and drain regions and having a first threshold voltage; and
  iv. a second channel region of a second area between the first source and drain regions and having a second threshold voltage different from the first threshold voltage;
  v. wherein the first and second areas depend upon an extent of misalignment between the implant region and the active region in a first dimension parallel to the plane, the first area increasing and the second area decreasing with misalignment in one direction in the first dimension; and b. forming a second test structure including:
  i. a second source region;
  ii. a second drain region;
  iii. a third channel region of the first area between the second source and drain regions and having the second threshold voltage; and
  iv. a fourth channel region of the second area between the second source and drain regions and having the first threshold voltage.

5. The method of claim 4, further comprising forming a first gate over the first and second channel regions and forming a second gate over the third and fourth channel regions.

6. The method of claim 5, further comprising:

a. measuring a fifth threshold voltage of the first structure by applying a first voltage signal to the first gate, the fifth threshold voltage being a function of the first and second threshold voltages; and b. measuring a sixth threshold voltage of the second structure by applying a second voltage signal to the second gate, the sixth threshold voltage being a function of the third and fourth threshold voltages.

7. The method of claim 6, further comprising comparing the fifth and sixth threshold voltages.

8. A method of measuring an extent of misalignment between a first plurality of implant and a respective plurality of implant regions, the method comprising:

a. forming a first plurality of transistors, each transistor having a threshold voltage that varies in proportion to the extent of misalignment;

b. forming a second plurality of transistors, each transistor having a threshold voltage that varies in inverse proportion to the extent of misalignment; and c. measuring the threshold voltages of each of the first and second pluralities of transistors.

9. The method of claim 8, wherein forming the first plurality of transistors comprises forming a gate structure for each of the first plurality of transistors, each gate structure having a first gate region of a first work function and a second gate region of a second work function different from the first work function.

10. The method of claim 9, wherein forming the second plurality of transistors comprises forming a gate structure for each of the second plurality of transistors, each gate structure having a third gate region of the first work function and a fourth gate region of the second work function different from the first work function.

11. The method of claim 8, wherein forming the first plurality of transistors comprises forming a channel region for each of the first plurality of transistors, each channel region having a first active region of a first channel-dopant concentration and a second active region of a second channel-dopant concentration different from the first channel-dopant concentration.

12. The method of claim 11, wherein forming the second plurality of transistors comprises forming a channel region for each of the second plurality of transistors, each channel region having a third active region of the first channel-dopant concentration and a fourth active region of the second channel-dopant concentration.

* * * * *